United States Patent
Sakaguchi (10) Patent No.: US 9,829,904 B2
(45) Date of Patent: Nov. 28, 2017

(54) LOW-PASS FILTER CIRCUIT AND POWER SUPPLY DEVICE

(71) Applicant: SII Semiconductor Corporation, Chiba-shi, Chiba (JP)

(72) Inventor: Kaoru Sakaguchi, Chiba (JP)

(73) Assignee: SII Semiconductor Corporation, Chiba-shi, Chiba (JP)

( * ) Notice: Subject to any disclaimer, the term of this patent is extended or adjusted under 35 U.S.C. 154(b) by 0 days.

(21) Appl. No.: 15/013,271

(22) Filed: Feb. 2, 2016

(65) Prior Publication Data

US 2016/0226467 A1    Aug. 4, 2016

(30) Foreign Application Priority Data

Feb. 2, 2015 (JP) ................................. 2015-018601

(51) Int. Cl.
*G05F 3/02* (2006.01)
*H03H 11/12* (2006.01)

(52) U.S. Cl.
CPC ............ *G05F 3/02* (2013.01); *H03H 11/126* (2013.01)

(58) Field of Classification Search
CPC ..... G05F 3/02; G05F 3/30; G05F 3/26; G05F 3/262; G05F 3/20; G05F 3/24; G05F 3/16
USPC ............... 323/273, 316, 313, 314, 315, 317; 327/558
See application file for complete search history.

(56) References Cited

U.S. PATENT DOCUMENTS

| | | | |
|---|---|---|---|
| 7,573,252 B1* | 8/2009 | Griesert | G05F 3/262 323/315 |
| 8,044,708 B2* | 10/2011 | Kume | G05F 1/56 327/143 |
| 8,471,538 B2* | 6/2013 | Pancholi | G05F 1/575 323/274 |
| 8,531,237 B2* | 9/2013 | Aisu | G05F 1/575 323/273 |
| 8,841,890 B2* | 9/2014 | Ochoa | G06K 19/0715 323/226 |
| 2012/0200327 A1* | 8/2012 | Sreekiran | H03L 7/0893 327/157 |

FOREIGN PATENT DOCUMENTS

JP     08-016259 A     1/1996

* cited by examiner

*Primary Examiner* — Timothy J Dole
*Assistant Examiner* — Shahzeb K Ahmad
(74) *Attorney, Agent, or Firm* — Brinks Gilson & Lione (57) ABSTRACT

To provide a low-pass filter circuit which is high in noise elimination capability and starts its output stably and at high speed, and a power supply device. A low-pass filter circuit is provided which is equipped with a capacitance element connected to an output terminal, and a resistance circuit connected between an input terminal and the output terminal, and in which the resistance circuit is equipped with a first MOS transistor connected between the input terminal and the output terminal, and an amplifier which has a first input terminal to which the input terminal is connected, a second input terminal to which the output terminal is connected, and an output terminal to which a gate of the first MOS transistor is connected, and which controls a time constant of the low-pass filter circuit.

8 Claims, 9 Drawing Sheets

FIG. 9
PRIOR ART

LOW-PASS FILTER CIRCUIT AND POWER SUPPLY DEVICE

RELATED APPLICATIONS

This application claims priority under 35 U.S.C. §119 to Japanese Patent Application No. 2015-018601 filed on Feb. 2, 2015, the entire content of which is hereby incorporated by reference.

BACKGROUND OF THE INVENTION

Field of the Invention

The present invention relates to a low-pass filter circuit, and a power supply device equipped with a low-pass filter circuit.

Background Art

Figure 9:
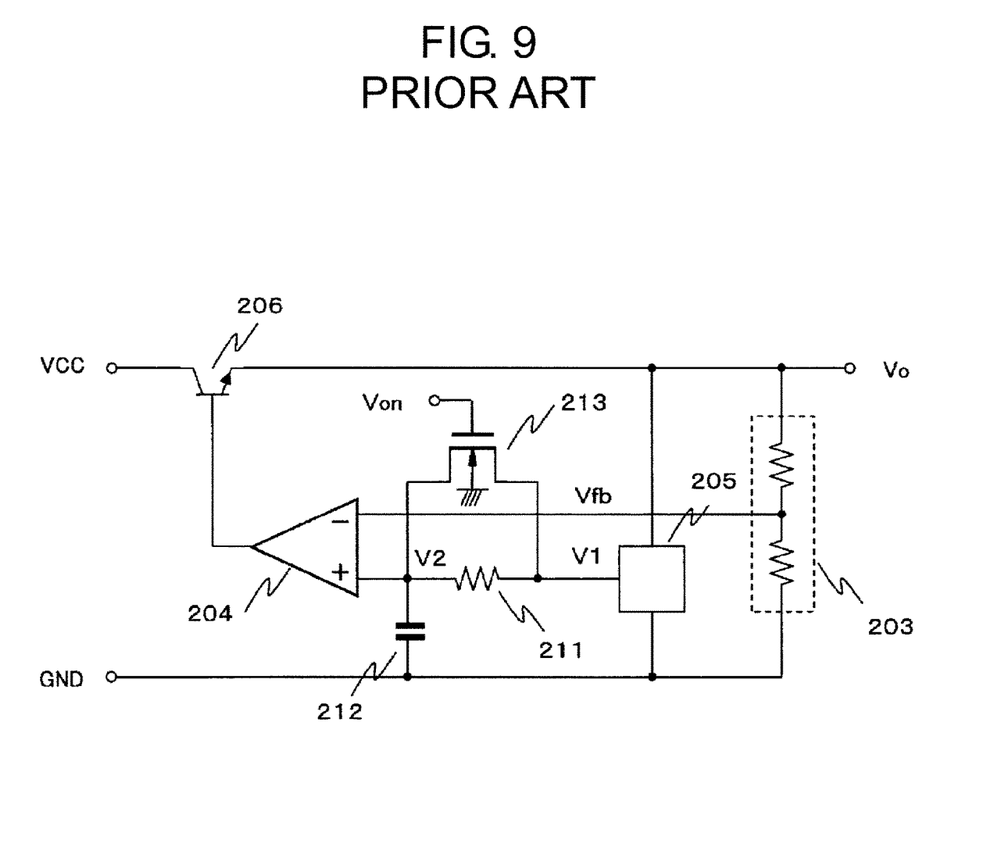
FIG. 9 is a circuit diagram illustrating a power supply device equipped with a related art low-pass filter circuit.

A related art low-pass filter circuit will be described. FIG. 9 is a circuit diagram of a power supply device equipped with the related art low-pass filter circuit.

The power supply device equipped with the related art low-pass filter circuit is comprised of a feedback circuit 203, an error amplifier circuit 204, a reference voltage source 205, an output transistor 206, a resistor 211, a capacitor 212, and an NMOS transistor 213.

A first reference voltage V1 outputted from the reference voltage source 205 is converted into a second reference voltage V2 from which high frequency noise is eliminated by a low-pass filter circuit formed by the resistor 211, the capacitor 212 and the NMOS transistor 213. The feedback circuit 203 divides a voltage Vo of a constant voltage output terminal to output a feedback voltage Vfb. The error amplifier circuit 204 is inputted with the second reference voltage V2 at a non-inversion input terminal and inputted with the feedback voltage Vfb at an inversion input terminal, and controls the output transistor 206 in such a manner that the second reference voltage V2 and the feedback voltage Vfb coincide with each other. With this configuration, a low-noise voltage based on the second reference voltage V2 is outputted to a power supply output terminal.

Further, a control voltage Von is inputted to a control terminal of the NMOS transistor 213. Since a time constant of the low-pass filter circuit becomes small when the control voltage Von is high and the NMOS transistor 213 is in an ON state, the second reference voltage V2 as the output voltage of the low-pass filter circuit is started at high speed. On the other hand, since the time constant of the low-pass filter circuit becomes large when the control voltage Von is low and the NMOS transistor 213 is in an OFF state, the noise elimination capability of the low-pass filter circuit becomes high. The control voltage Von is generated by a control circuit described in, for example, FIG. 2 of Patent Document 1.

The power supply device can be realized which is started at high speed and provides a low-noise output voltage by switching the time constant of the low-pass filter circuit using the control voltage Von in this manner.

[Patent Document 1] Japanese Patent Application Laid-Open No. Hei 8 (1996)-16259

SUMMARY OF THE INVENTION

The related art technology is however accompanied by a problem that when there exist variations in the characteristics of elements constituting a delay circuit of a control circuit, a malfunction of the control circuit due to power supply noise, etc., the logic of a time constant switching signal is switched earlier than a desired timing, thereby increasing the time constant of a low-pass filter circuit and making the starting of an output voltage slow. Particularly, when a cutoff frequency of the low-pass filter circuit is set low to enhance noise elimination capability of a reference voltage, the problem becomes remarkable. Further, a problem arises in that when a transiently large fluctuation occurs in an output voltage of a low-pass filter circuit even after its startup, the restoration of the output voltage becomes slow because the time constant is large.

The present invention has been made with the foregoing problems in view, and provides a low-pass filter circuit which starts an output stably and at high speed without depending on variations in the characteristics of a control circuit and a malfunction thereof, and a power supply device equipped with a low-pass filter circuit.

In order to solve the related art problems, the low-pass filter circuit of the present invention is configured as follows:

The low-pass filter circuit is provided which is equipped with a capacitance element connected to an output terminal, and a resistance circuit connected between an input terminal and the output terminal, and in which the resistance circuit is equipped with a first MOS transistor connected between the input terminal and the output terminal, and an amplifier which has a first input terminal to which the input terminal is connected, a second input terminal to which the output terminal is connected, and an output terminal to which a gate of the first MOS transistor is connected, and which controls a time constant of the low-pass filter circuit.

There can be obtained a low-pass filter circuit whose output is started stably and at high speed even when a cut-off frequency is low, because the starting of an output voltage of the low-pass filter circuit is not affected by variations in the characteristics of a control circuit and a malfunction thereof if the circuit configuration of the present invention is used. Further, if the circuit configuration of the present invention is used, the output of the low-pass filter circuit can be restored stably and at high speed even if a large fluctuation occurs in the output voltage of the low-pass filter circuit after the start-up thereof.

DETAILED DESCRIPTION OF THE PREFERRED EMBODIMENTS

Figure 1:
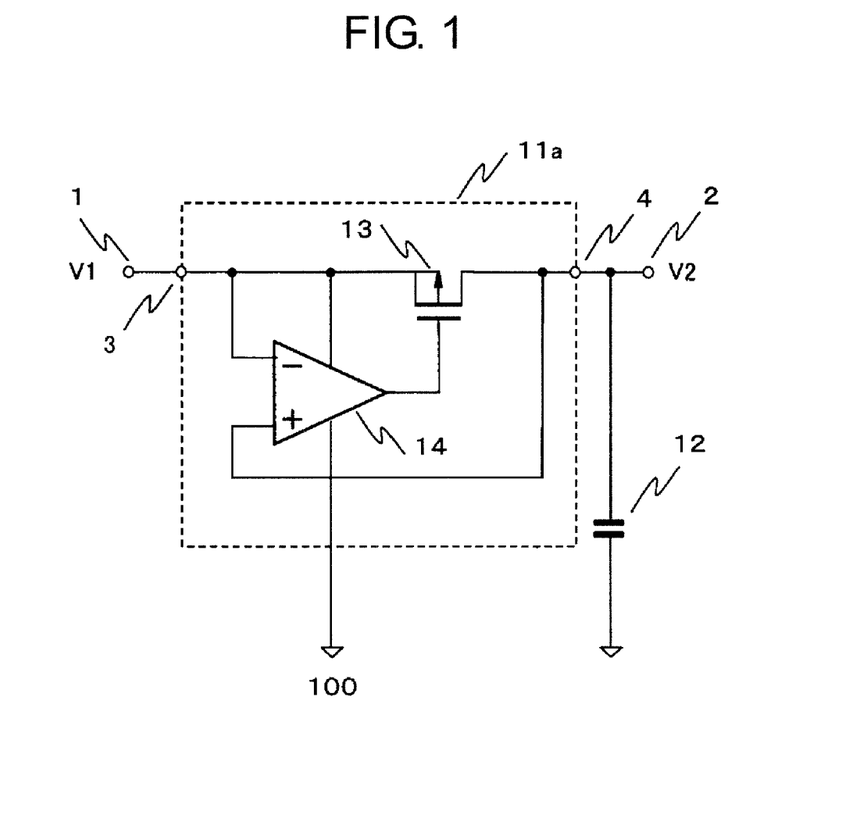
FIG. 1 is a circuit diagram illustrating a low-pass filter circuit according to a first embodiment.

FIG. 1 is a circuit diagram illustrating a low-pass filter circuit according to a first embodiment.

A low-pass filter circuit in the present embodiment is equipped with a resistance circuit 11a, a capacitance element 12, an input terminal 1, and an output terminal 2. The resistance circuit 11a is equipped with a MOS transistor 13, an amplifier 14, a terminal 3, and a terminal 4.

In the resistance circuit 11a, the terminal 3 thereof is connected to the input terminal 1, and the terminal 4 thereof is connected to the output terminal 2. The capacitance element 12 has one terminal connected to the terminal 4, and the other terminal connected to a reference terminal 100. The MOS transistor 13 has a source connected to the terminal 3, a drain connected to the terminal 4, and a gate connected to the output of the amplifier 14. The amplifier 14 has an inversion input terminal connected to the terminal 3, and a non-inversion input terminal connected to the terminal 4.

The operation of the low-pass filter circuit in the present embodiment will next be described.

Since a voltage V2 of the output terminal 2 is lower than a voltage V1 of the input terminal 1 when the low-pass filter circuit is started up, i.e., a prescribed voltage signal is inputted to the input terminal 1, the amplifier 14 controls a gate voltage of the MOS transistor 13 in such a manner that an on resistance of the MOS transistor 13 becomes small. As a result, since a time constant of the low-pass filter circuit formed by the MOS transistor 13 and the capacitance element 12 becomes small at its startup, the output terminal voltage V2 is started at high speed.

After the startup, i.e., when the output terminal voltage V2 is raised and approaches the input terminal voltage V1, the amplifier 14 controls the gate voltage of the MOS transistor 13 in such a manner that the on resistance of the MOS transistor 13 becomes large. As a result, since the time constant of the low-pass filter circuit formed by the MOS transistor 13 and the capacitance element 12 becomes large, the noise elimination capability of the low-pass filter circuit is enhanced.

In the low-pass filter circuit of the present embodiment, since the time constant thereof is controlled based on the difference in voltage between the input terminal and the output terminal, the output of the low-pass filter circuit is started stably and at high speed without depending on the operation of and variations in other circuits. Further, even when the voltage of the output terminal drops after the startup, it is possible to restore the output in like manner.

Incidentally, in order to adjust the resistance value of the resistance circuit 11a, the MOS transistor 13 may be replaced with a plurality of transistors connected in series or in parallel. Further, in order to prevent the output of the low-pass filter circuit from becoming unstable due to the flow of a forward current into a parasitic diode existing between the drain and backgate of the MOS transistor 13, a resistor may be provided between the source and backgate thereof.

Figure 2:
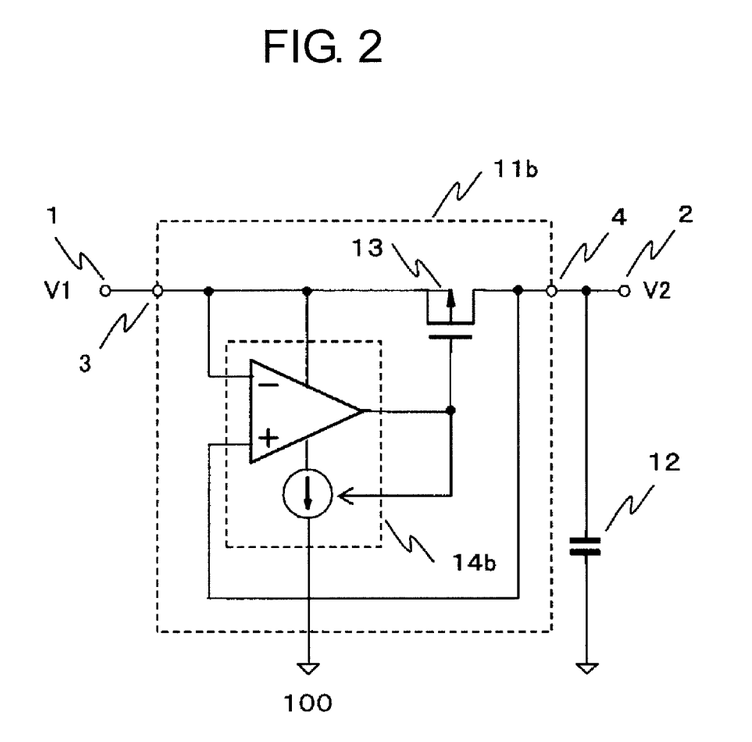
FIG. 2 is a circuit diagram illustrating a low-pass filter circuit according to a second embodiment.

FIG. 2 is a circuit diagram illustrating a low-pass filter circuit according to a second embodiment.

A low-pass filter circuit in the second embodiment is equipped with a resistance circuit 11b configured by a MOS transistor 13 and an amplifier 14b. The amplifier 14b is equipped with a bias current source having a control terminal connected to an output terminal of the amplifier 14b.

The low-pass filter circuit in the present embodiment is similar in basic operation to the low-pass filter circuit according to the first embodiment.

In the low-pass filter circuit of the present embodiment, the amplifier 14b is configured such that a bias current is variably controlled based on an output voltage of the amplifier 14b. When an on resistance of the MOS transistor 13 is controlled to be large, the bias current is reduced in the amplifier 14b so that the band of the amplifier 14b becomes narrow. Thus, since the output of the amplifier 14b does not fluctuate rapidly when the time constant is large, it becomes easy for the time constant of the low-pass filter circuit to be maintained in a large state.

Thus, the low-pass filter circuit in the present embodiment is capable of obtaining an effect that the operation of the low-pass filter circuit is stable with respect to the low-pass filter circuit in the first embodiment.

Figure 3:
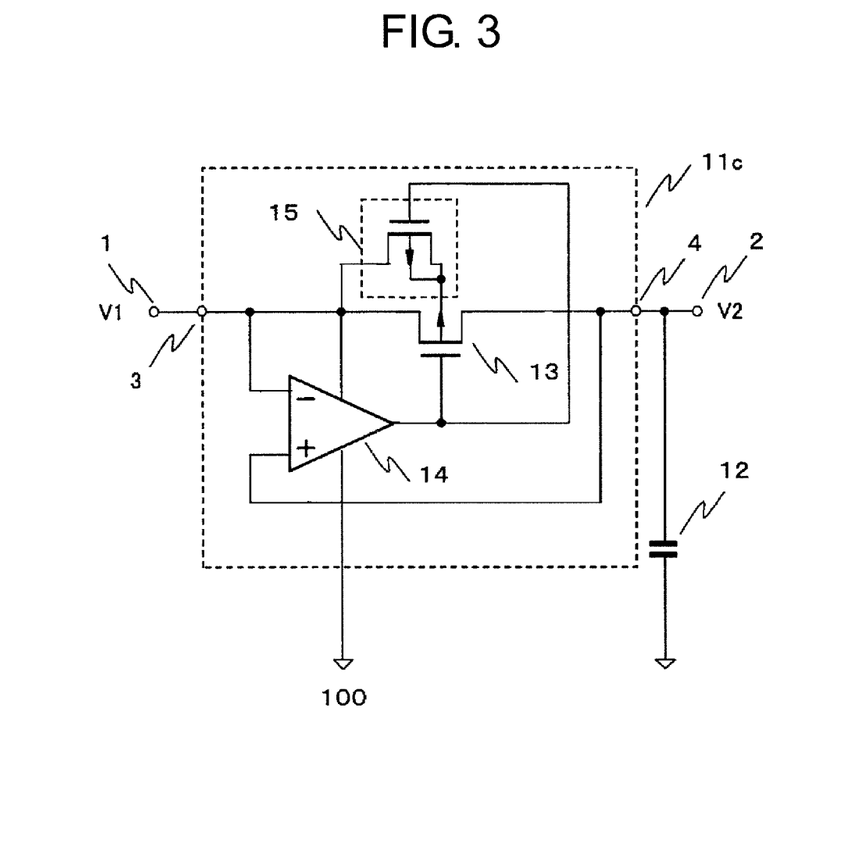
FIG. 3 is a circuit diagram illustrating a low-pass filter circuit according to a third embodiment.

FIG. 3 is a circuit diagram illustrating a low-pass filter circuit according to a third embodiment.

A low-pass filter circuit in the third embodiment is equipped with a resistance circuit 11c comprised of a MOS transistor 13, MOS transistor 15, and an amplifier 14. The MOS transistor 15 has a gate connected to an output terminal of the amplifier 14, a source connected to a terminal 3, and a drain and a backgate both connected to a backgate of the MOS transistor 13.

The low-pass filter circuit in the present embodiment is similar in basic operation to the low-pass filter circuit according to the first embodiment.

In the low-pass filter circuit in the present embodiment, when the amplifier 14 controls a gate of the MOS transistor 13 in such a manner that a time constant of the low-pass filter circuit becomes large, an on resistance of the MOS transistor 15 also becomes large in like manner. Thus, in the MOS transistor 13, a forward current becomes difficult to flow in a parasitic diode that exists between a drain of the MOS transistor 13 and its backgate.

Accordingly, the low-pass filter circuit in the present embodiment can obtain an effect that it is stable in operation as with the low-pass filter circuit in the second embodiment.

Incidentally, since the impedance of the backgate of the MOS transistor 13 becomes high, the low-pass filter circuit may be configured as indicated below to operate it more stably. For example, the MOS transistor 13 is arranged in such a manner that a resistor is connected between the backgate thereof and the terminal 3. Also, for example, the MOS transistor 13 is arranged in such a manner that a capacitance element is connected between the backgate thereof and a reference terminal 100.

Figure 4:
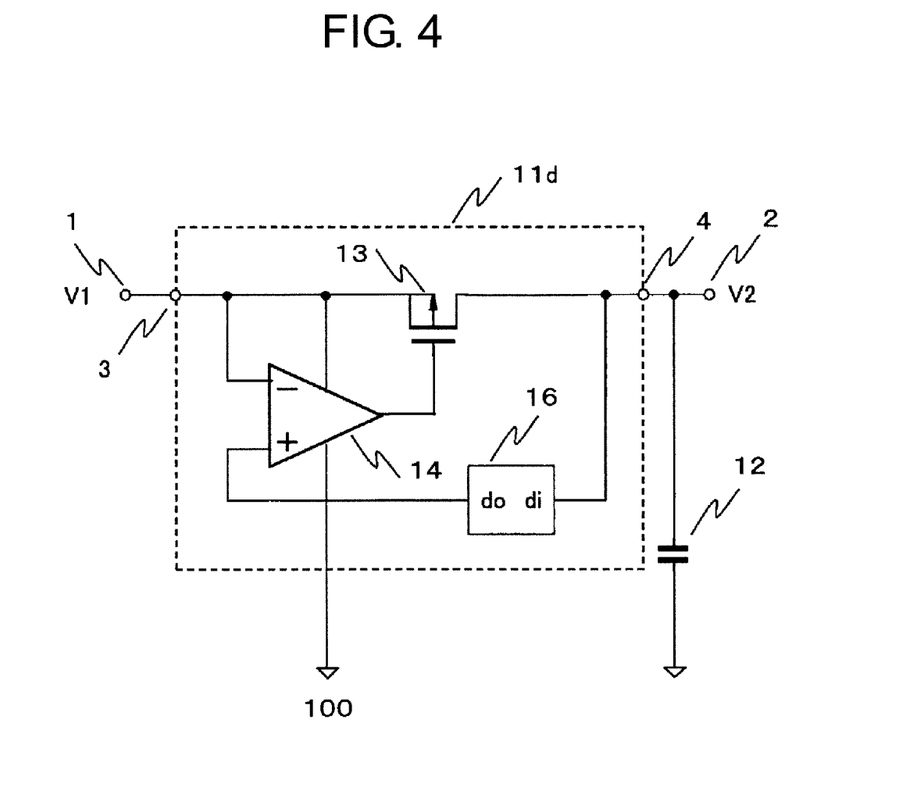
FIG. 4 is a circuit diagram illustrating a low-pass filter circuit according to a fourth embodiment.

FIG. 4 is a circuit diagram illustrating a low-pass filter circuit according to a fourth embodiment.

A resistance circuit 11d of a low-pass filter circuit in the fourth embodiment is equipped with a delay circuit 16 between a non-inversion input terminal of an amplifier 14 and a terminal 4.

The delay circuit 16 has an output terminal do connected to the non-inversion input terminal of the amplifier 14, and an input terminal di connected to the terminal 4.

The low-pass filter circuit in the present embodiment is similar in basic operation to the low-pass filter circuit according to the first embodiment.

In the low-pass filter circuit in the present embodiment, the voltage of the non-inversion input terminal of the amplifier 14 fluctuates with being delayed by a delay time determined by the delay circuit 16 with respect to a change in a voltage V2 of an output terminal 2. Therefore, a delay occurs even in the time taken to control a gate of the MOS transistor 13.

Thus, the timing provided to switch a time constant of the low-pass filter circuit can intentionally be adjusted by adjusting the delay time of the delay circuit 16, thus increasing arbitrariness in design.

Further, owing to the existence of the delay circuit 16, it is possible to prevent the time constant of the low-pass filter circuit from being frequently switched with respect to the fluctuation in the output terminal voltage V2, and to operate the low-pass filter circuit more stably.

Incidentally, although the delay circuit 16 is connected to the non-inversion input terminal side of the amplifier 14, the delay circuit 16 may be connected to the inversion input terminal side or the output terminal side according to the design intention or may be connected to a plurality of those terminals. Alternatively, the delay times of a plurality of delay circuits may be adjusted separately.

Figure 5:
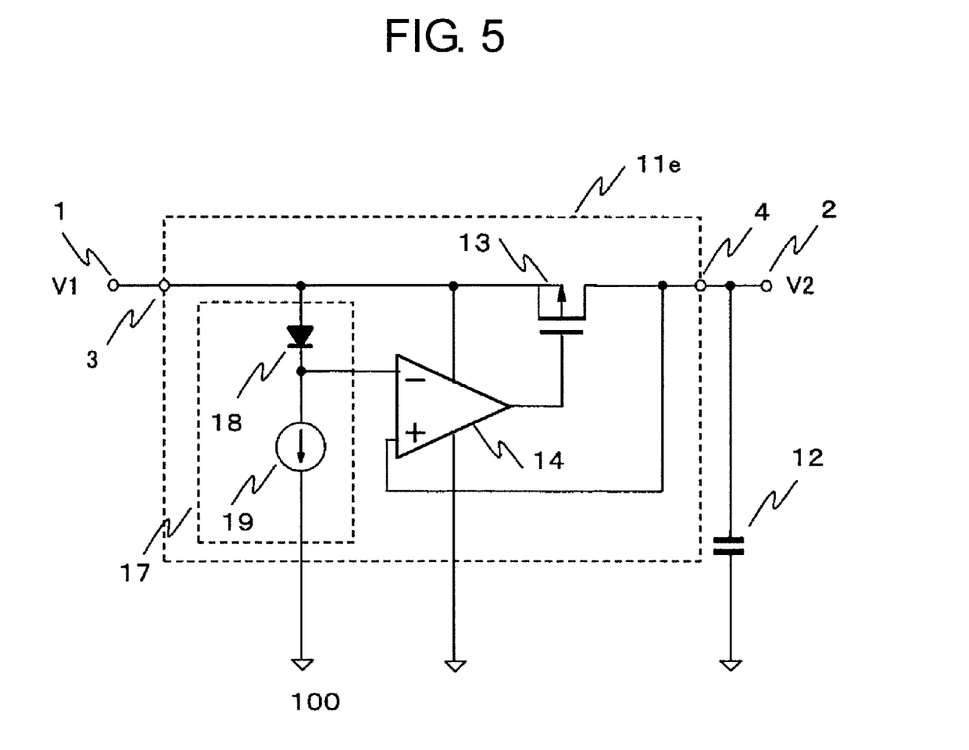
FIG. 5 is a circuit diagram illustrating a low-pass filter circuit according to a fifth embodiment.

FIG. 5 is a circuit diagram illustrating a low-pass filter circuit according to a fifth embodiment.

A resistance circuit 11e of a low-pass filter circuit in the fifth embodiment is further equipped with a voltage generating circuit 17. The voltage generating circuit 17 is equipped with, for example, a diode 18 and a current source 19.

The diode 18 and the current source 19 are connected in series between a terminal 3 and a reference terminal 100. A connecting point of the diode 18 and the current source 19 is connected to an inversion input terminal of an amplifier 14.

The low-pass filter circuit in the present embodiment is similar in basic operation to the low-pass filter circuit according to the first embodiment.

In the low-pass filter circuit in the present embodiment, the voltage of the inversion input terminal of the amplifier 14 becomes a voltage V1' dropped by a voltage generated across the diode 18 with respect to a voltage V1 of an input terminal 1. Therefore, when a voltage V2 of an output terminal 2 in the low-pass filter circuit reaches the voltage V1', the amplifier 14 controls a time constant of the low-pass filter circuit to be large.

Thus, even in the case where the input terminal voltage V1 and the output terminal voltage V2 do not coincide with each other by generation of a load current in an output terminal 4 of the low-pass filter circuit due to a leakage current in a semiconductor device, etc., an effect equivalent to that of the low-pass filter circuit according to the first embodiment can be exhibited.

Incidentally, the voltage generating circuit 17 may generate the voltage V1' lower than the voltage V1 and is not limited to it. For example, a resistive element such as a polysilicon resistor or the like may be used instead of the diode 18.

Figure 6:
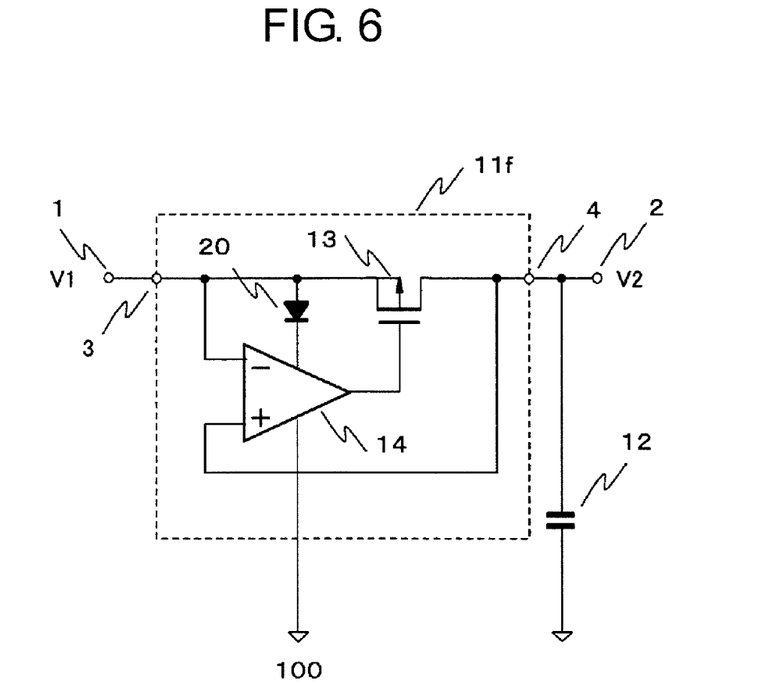
FIG. 6 is a circuit diagram illustrating a low-pass filter circuit according to a sixth embodiment.

FIG. 6 is a circuit diagram illustrating a low-pass filter circuit according to a sixth embodiment.

A resistance circuit 11f of a low-pass filter circuit in the sixth embodiment is provided with a diode 20 at a positive power supply terminal of an amplifier 14.

The low-pass filter circuit in the present embodiment is similar in basic operation to the low-pass filter circuit according to the first embodiment.

The low-pass filter circuit in the present embodiment brings about an effect that since the upper limit of amplitude of an output voltage of the amplifier 14 becomes low because a positive power supply voltage of the amplifier 14 becomes a voltage reduced by a prescribed voltage generated across the diode 20 from a voltage V1, an on resistance of a MOS transistor 13 does not become larger than a prescribed value, i.e., a time constant of the low-pass filter circuit does not become extremely large.

Thus, the low-pass filter circuit in the present embodiment makes it easy to control the operation of the low-pass filter circuit by narrowing a range in which the time constant of the low-pass filter circuit changes.

Incidentally, although the diode 20 is connected to the positive power supply terminal side of the amplifier 14, the diode 20 may be connected to the negative power supply terminal side and configured to prevent the time constant of the low-pass filter circuit from becoming extremely small. Further, a resistive element which generates a voltage may be used instead of the diode 20.

Figure 7:
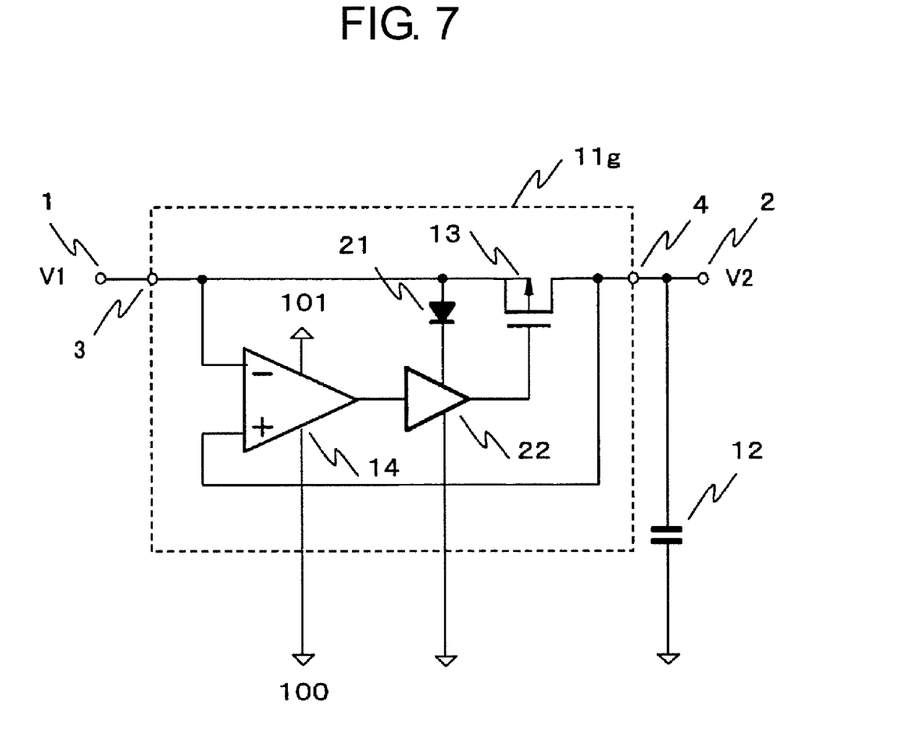
FIG. 7 is a circuit diagram illustrating a low-pass filter circuit according to a seventh embodiment.

FIG. 7 is a circuit diagram illustrating a low-pass filter circuit according to a seventh embodiment.

A resistance circuit 11g of a low-pass filter circuit in the seventh embodiment is equipped with a buffer 22 between a gate of a MOS transistor 13 and an output terminal of an amplifier 14. The buffer 22 is connected to a diode 21 between a terminal 3 and a positive power supply terminal thereof. Further, a positive power supply terminal of the amplifier 14 is connected to a power supply terminal 101.

The low-pass filter circuit in the present embodiment is similar in basic operation to the low-pass filter circuit according to the first embodiment.

In the low-pass filter circuit in the present embodiment, an output signal of the amplifier 14 is inputted to the gate of the MOS transistor 13 via the buffer. Thus, even in the case of such a low voltage V1 that the output of the amplifier becomes an unstable state, the output voltage of the amplifier 14 does not become unstable, thus making it possible to stably operate the low-pass filter circuit.

Figure 8:
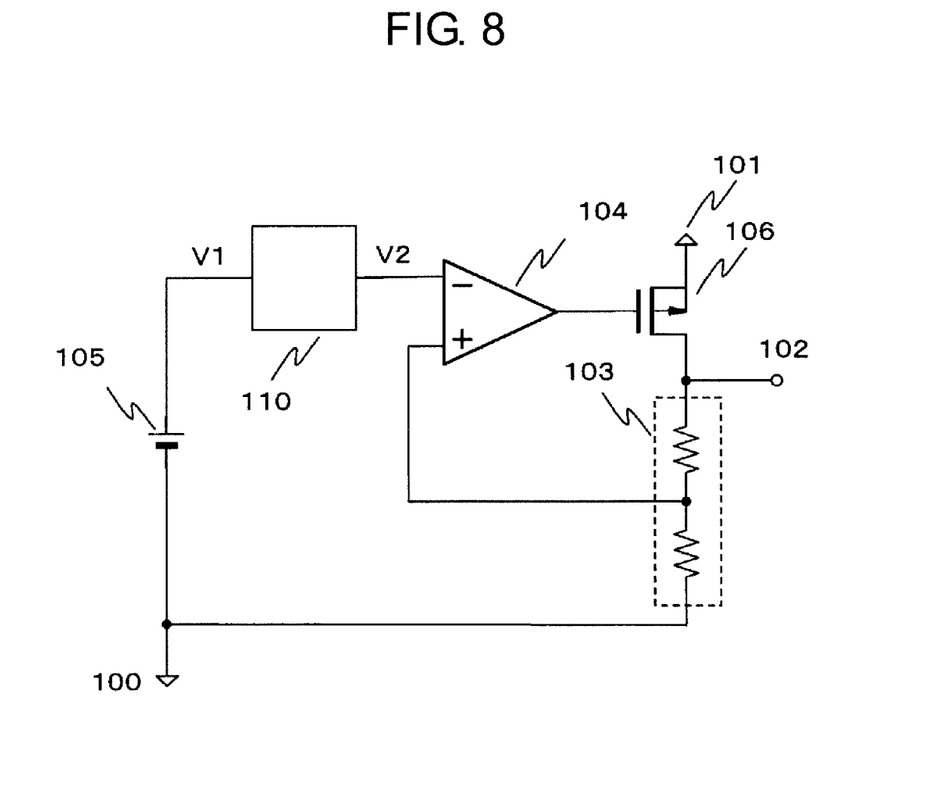
FIG. 8 is a circuit diagram illustrating a power supply device equipped with a low-pass filter circuit of the present invention.

FIG. 8 is a circuit diagram illustrating a power supply device equipped with a low-pass filter circuit of the present invention.

The power supply device illustrated in FIG. 8 is equipped with a reference terminal 100, a power supply terminal 101, a constant voltage output terminal 102, a feedback circuit 103, an error amplifier 104, a reference voltage source 105, an output transistor 106, and a low-pass filter circuit 110. The low-pass filter circuit 110 is connected between an output terminal of the reference voltage source 105 and an inversion input terminal of the error amplifier 104.

The low-pass filter circuit 110 converts a voltage V1 of the reference voltage source 105 into a stabilized voltage V2. Since the amplifier 104 controls the voltage of the constant voltage output terminal 102, based on the voltage V2, the amplifier 104 is capable of outputting a low-noise voltage.

Further, the power supply device starts an output stably and at high speed by using the low-pass filter circuit of the present invention without being affected by variations in the characteristics of elements constituting a control circuit and the malfunction of the elements.

Incidentally, the low-pass filter circuit 110 may combine in plural the features of the low-pass filter circuits according to the first through seventh embodiments. Further, a plurality of filters may be connected in series or in parallel.

As described above, the low-pass filter circuit of the present invention, and the power supply device equipped therewith are capable of making starting and returning of an output voltage faster even when the time constant of the low-pass filter circuit is small. Thus, it is possible to provide a low-pass filter circuit which is high in noise elimination capability and starts the output thereof stably and at high speed, and a power supply device.

What is claimed is:

1. A low-pass filter circuit which cuts off a voltage of an input terminal with a prescribed cutoff frequency and outputs the cut-off voltage to an output terminal, said low-pass filter circuit comprising:

a capacitance element connected to the output terminal; and a resistance circuit connected between the input terminal and the output terminal, wherein the resistance circuit is equipped with:

a first MOS transistor connected between the input terminal and the output terminal, and an amplifier which has a first input terminal connected to the input terminal, has a second input terminal connected to the output terminal, and an output terminal of the amplifier connected to a gate terminal of the first MOS transistor, wherein a time constant of the low-pass filter circuit is controlled by the capacitor element and the first MOS transistor in the resistance circuit, wherein the amplifier is equipped with a bias current source having a control terminal to which the output terminal of the amplifier is connected, and wherein the bias current source becomes small in current when an on resistance of the first MOS transistor is large.

2. The low-pass filter circuit according to claim 1, wherein the resistance circuit is equipped with a delay circuit between the output terminal and the second input terminal of the amplifier.

3. The low-pass filter circuit according to claim 1, wherein the resistance circuit is equipped with a voltage generating circuit at the first input terminal of the amplifier.

4. The low-pass filter circuit according to claim 1, which is equipped with a diode at a positive power supply terminal of the amplifier.

5. The low-pass filter circuit according to claim 1, wherein the resistance circuit is equipped with a buffer between the output terminal of the amplifier and the gate of the first MOS transistor, and wherein the resistance circuit is equipped with a diode at a positive power supply terminal of the buffer.

6. A power supply device comprising:

an error amplifier circuit which inputs a voltage of a feedback circuit connected to an output terminal, and a reference voltage of a reference voltage source to control an output transistor, wherein the low-pass filter circuit according to claim 1 is provided between the reference voltage source and an input terminal of the error amplifier circuit.

7. A low-pass filter circuit which cuts off a voltage of an input terminal with a prescribed cutoff frequency and outputs the cut-off voltage to an output terminal, said low-pass filter circuit comprising:

a capacitance element connected to the output terminal; and a resistance circuit connected between the input terminal and the output terminal, wherein the resistance circuit is equipped with:

a first MOS transistor connected between the input terminal and the output terminal, and an amplifier which has a first input terminal connected to the input terminal, has a second input terminal connected to the output terminal, and an output terminal of the amplifier connected to a gate terminal of the first MOS transistor, wherein a time constant of the low-pass filter circuit is controlled by the capacitor element and the first MOS transistor in the resistance circuit, wherein the resistance circuit is equipped with a second MOS transistor having a drain and a source connected to the input terminal and a backgate of the first MOS transistor, and a gate connected to the output terminal of the amplifier.

8. A power supply device comprising:

an error amplifier circuit which inputs a voltage of a feedback circuit connected to an output terminal, and a reference voltage of a reference voltage source to control an output transistor, wherein the low-pass filter circuit according to claim 7 is provided between the reference voltage source and an input terminal of the error amplifier circuit.

* * * * *